(12) United States Patent
Duan et al.

(10) Patent No.: US 11,303,059 B2
(45) Date of Patent: Apr. 12, 2022

(54) ELECTRICAL CONNECTOR WITH HEAT SINK SECURING STRUCTURE

(71) Applicant: Dongguan Luxshare Technologies Co., Ltd, Dongguan (CN)

(72) Inventors: BaiYu Duan, Dongguan (CN); Zhen Luo, Dongguan (CN); XiaoKai Wang, Dongguan (CN); XiaoPing Wu, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 17/028,219

(22) Filed: Sep. 22, 2020

(65) Prior Publication Data
US 2021/0098926 A1 Apr. 1, 2021

(30) Foreign Application Priority Data
Sep. 30, 2019 (CN) .......................... 201921657499.8

(51) Int. Cl.
*H01R 13/46* (2006.01)
(52) U.S. Cl.
CPC .................................. *H01R 13/46* (2013.01)
(58) Field of Classification Search
CPC ....................................................... H01R 13/46
USPC ......................................................... 439/487
See application file for complete search history.

(56) References Cited

U.S. PATENT DOCUMENTS

| | | | |
|---|---|---|---|
| 6,980,437 B2* | 12/2005 | Bright | H04B 1/036 165/185 |
| 7,529,094 B2* | 5/2009 | Miller | G02B 6/4246 165/185 |
| 7,539,018 B2* | 5/2009 | Murr | H05K 7/20418 165/185 |
| 8,371,861 B1* | 2/2013 | Cina | H01R 13/6461 439/62 |
| 8,449,331 B2* | 5/2013 | Phillips | H01R 13/6581 439/607.21 |
| 8,556,658 B2* | 10/2013 | Szczesny | G02B 6/4278 439/607.2 |
| 8,599,559 B1* | 12/2013 | Morrison | H05K 9/0058 361/702 |

(Continued)

*Primary Examiner* — Harshad C Patel
(74) *Attorney, Agent, or Firm* — Birch, Stewart, Kolasch & Birch, LLP

(57) ABSTRACT

The present disclosure provides an electrical connector comprising: an electrical connector housing comprising an upper surface, a lower surface, and two opposite sidewalls; at least one positioning component disposed on an upper surface of the electrical connector housing; a plurality of heat sinks are disposed on the upper surface of the electrical connector housing; the plurality of the heat sinks are respectively disposed on two sides of the corresponding positioning component; each heat sink comprises at least one securing groove; the securing grooves of the heat sinks disposed correspondingly; the plurality of securing grooves correspond to the positioning components; and a securing structure is secured to the at least one the positioning component and the two sidewalls of the electrical connector housing. The securing structure presses the plurality of the heat sinks against the upper surface of the electrical connector housing.

15 Claims, 15 Drawing Sheets

(56) References Cited

U.S. PATENT DOCUMENTS

| | | | | |
|---|---|---|---|---|
| 8,670,236 B2* | 3/2014 | Szczesny | ............ | H05K 9/0009 |
| | | | | 361/704 |
| 8,885,342 B2* | 11/2014 | Skepnek | ............... | H01L 23/433 |
| | | | | 361/709 |
| 9,160,090 B2* | 10/2015 | Su | ...................... | H01R 13/6594 |
| 9,787,034 B2* | 10/2017 | Yang | .................... | G02B 6/3817 |
| 10,069,248 B2* | 9/2018 | Su | ...................... | H01R 13/6583 |
| 10,073,231 B1* | 9/2018 | Yang | ................... | H01R 13/502 |
| 10,477,729 B2* | 11/2019 | Han | ........................ | F28F 9/001 |
| 10,886,661 B2* | 1/2021 | Liu | .......................... | G06F 1/20 |
| 10,950,983 B2* | 3/2021 | Liu | ..................... | H01R 13/516 |
| 11,058,033 B2* | 7/2021 | Han | .................... | G02B 6/4269 |
| 2003/0161108 A1* | 8/2003 | Bright | ................ | G02B 6/4277 |
| | | | | 361/707 |
| 2007/0183128 A1* | 8/2007 | Pirillis | ............... | H05K 7/20418 |
| | | | | 361/715 |

* cited by examiner

ELECTRICAL CONNECTOR WITH HEAT SINK SECURING STRUCTURE

CROSS REFERENCE TO RELATED APPLICATION

This application claims the priority benefit of Chinese Patent Application Serial Number 201921657499.8, filed on Sep. 30, 2019, the full disclosure of which is incorporated herein by reference.

BACKGROUND

Technical Field

The present disclosure relates to the technical field of electrical connector, and more particularly to an electrical connector comprising heat sinks.

Related Art

The conventional electrical connectors are provided with heat sinks dissipating heat generated by the electrical connector to the outside to prevent the operation of the connectors from being affected by the heat accumulation therein. However, the fastness of the connection between the heat sink and the electrical connector is often loosened, which causes the heat sink to easily fall off from the electrical connector, resulting in inconvenience.

SUMMARY

The embodiments of the present disclosure provide an electrical connector to deal with the issue that the fastness of the connection between the heat sink and the electrical connector is often loosened, which causes the heat sink to easily fall off from the electrical connector.

The present disclosure provides an electrical connector comprising: an electrical connector housing comprising an upper surface, a lower surface, and two opposite sidewalls; at least one positioning component disposed on the upper surface of the electrical connector housing; a plurality of heat sinks disposed on the upper surface of the electrical connector housing; the plurality of the heat sinks are respectively disposed on two sides of the corresponding positioning component; each heat sink comprises at least one securing groove; the securing groove of a heat sink correspond to the securing grooves of other heat sinks; the plurality of the securing grooves correspond to the positioning components; and a securing structure secured to at least one of the positioning component and the two sidewalls of the electrical connector housing; the securing structure presses the plurality of the heat sinks against the upper surface of the electrical connector housing.

The embodiments of the present disclosure could secure heat sinks to the electrical connector housing by the securing structure and could secure the securing structure to the electrical connector housing by the positioning component to prevent the securing structure from detaching from the electrical connector housing, which improves the stability of the securing of heat sinks to the electrical connector housing.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
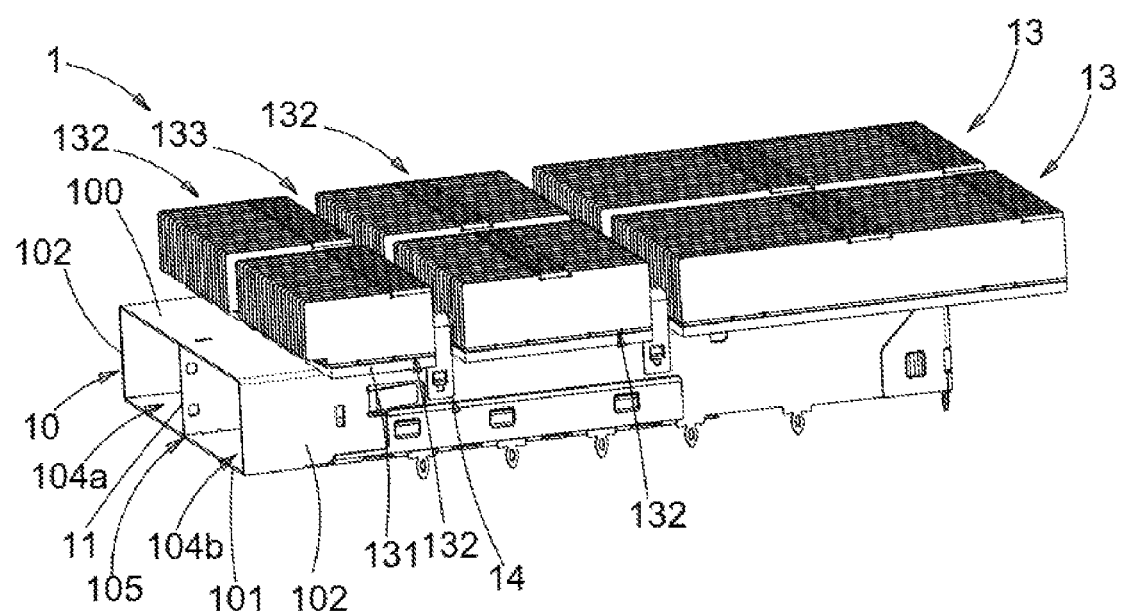
FIG. 1 is a perspective view of an electrical connector of the first embodiment of the present disclosure.

The present invention will now be described more fully hereinafter with reference to the accompanying drawings, in which exemplary embodiments of the invention are shown. This present invention may, however, be embodied in many different forms and should not be construed as limited to the embodiments set forth herein. Rather, these embodiments are provided so that this present invention will be thorough and complete, and will fully convey the scope of the present invention to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/ substantially" means, within an acceptable error range, the person skilled in the art may solve the technical problem in a certain error range to achieve the basic technical effect.

The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that includes a series of elements not only include these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the invention.

In the following embodiments, the same or similar elements will be indicated by the same reference numerals.

Figure 2:
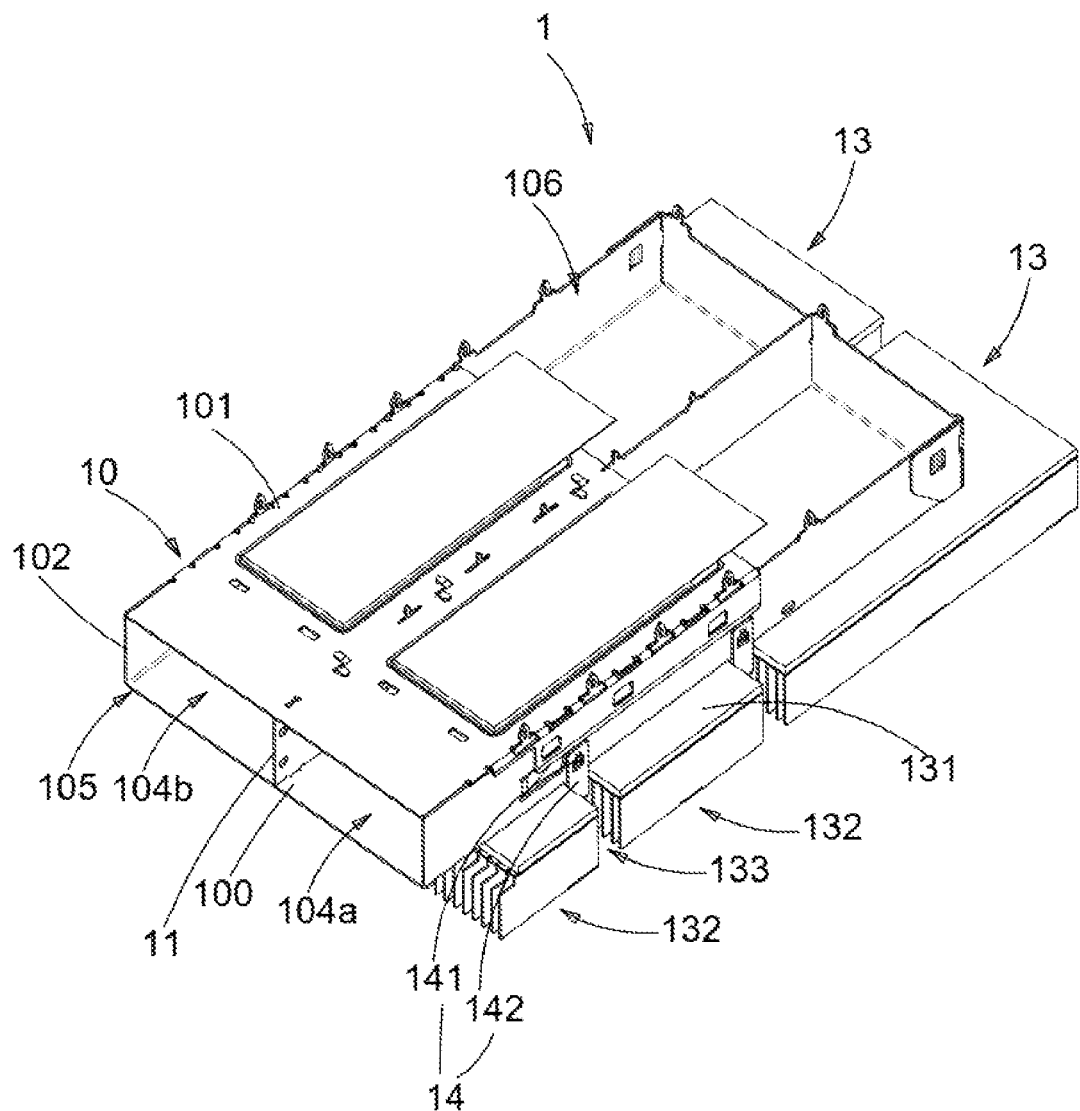
FIG. 2 is another perspective view of the electrical connector of the first embodiment of the present disclosure.
Figure 3:
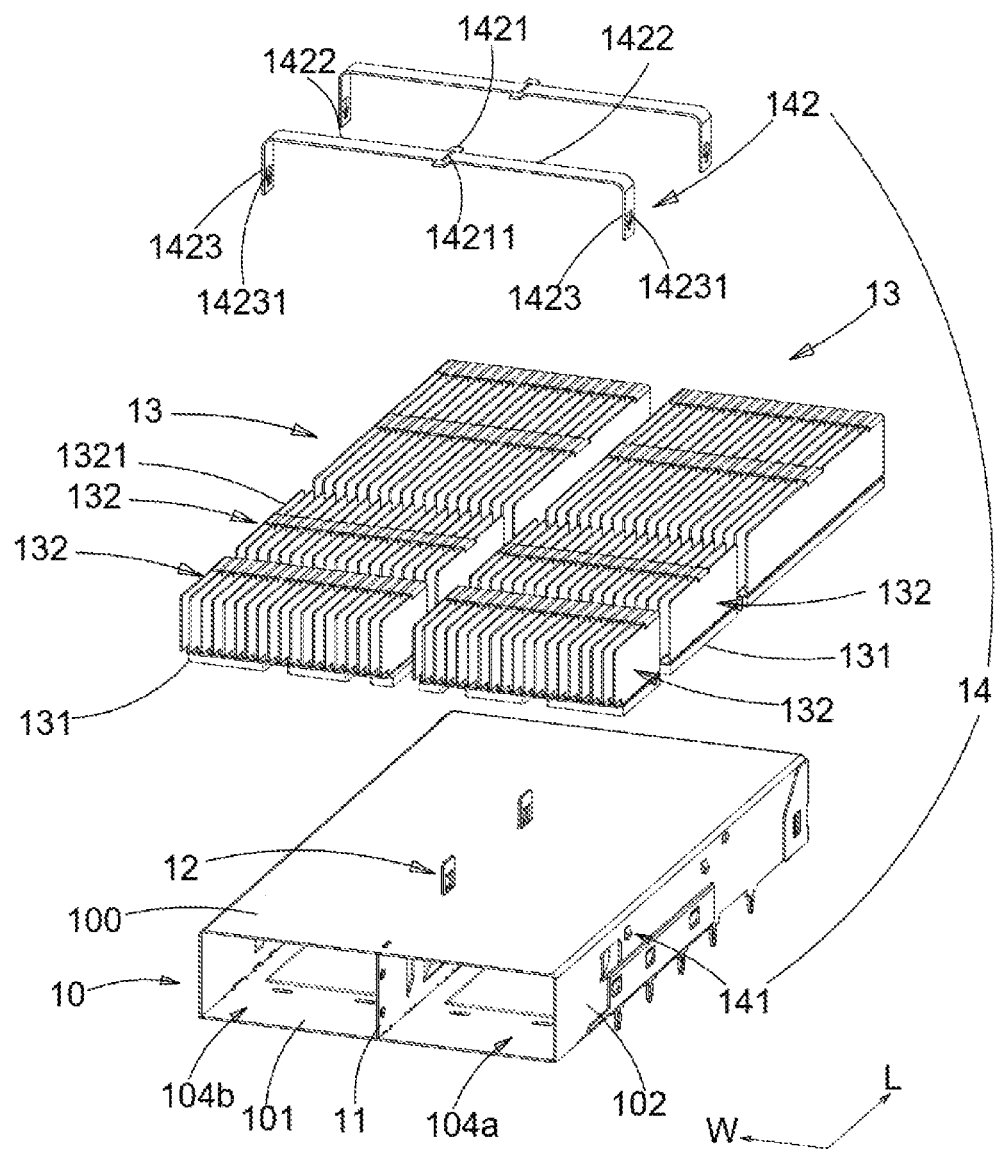
FIG. 3 is an exploded view of the electrical connector of the first embodiment of the present disclosure.

FIG. 1 to FIG. 3 are perspective views and exploded view of the electrical connector of the first embodiment of the present disclosure providing an electrical connector 1 comprising an electrical connector housing 10, at least one positioning component 12, a plurality of heat sinks 13 and a securing structure 14. The electrical connector housing 10 comprising an upper surface 100, a lower surface 101, and two sidewalls 102 oppositely disposed. At least one positioning component 12 is disposed on the upper surface 100 of the electrical connector housing 10. The plurality of heat sinks 13 are disposed on the upper surface 100 of the electrical connector housing 10. The plurality of the heat sinks 13 are respectively disposed on two sides of the corresponding positioning component 12. Each heat sink 13 comprises at least one securing groove 133. The securing groove 133 of a heat sink 13 correspond to the securing grooves 133 of other heat sinks. The plurality of the securing grooves 133 correspond to at least one positioning component 12. The securing structure 14 is secured to at least one of the positioning component 12 and the two sidewalls of the electrical connector housing 10. The securing structure 14 presses the plurality of the heat sinks 13 against the upper surface 100 of the electrical connector housing 10.

The electrical connector 1 of the present embodiment comprises two electrical connector bodies (not shown), an electrical connector housing 10, a partition plate 11, a positioning component 12, two heat sinks 13, and a securing structure 14. The electrical connector housing 10 comprises an upper surface 100, a lower surface 101, two opposite sidewalls 102, a first accommodating space 104a, a second accommodating space 104b, a first opening 105, and a second opening 106. The first opening 105 is disposed at one end of the upper surface 100, the lower surface 101, and the two sidewalls 102. The second opening 106 is disposed on the lower surface 101. The second opening 106 is away from the first opening 105, which indicates that one end of the electrical connector housing 10 opposite to the first opening 105 is closed. The partition plate 11 is disposed in the electrical connector housing 10. Two sides of the partition plate 11 are connected to the upper surface 100 and the lower surface 101 of the electrical connector housing 10, and are parallel to the sidewalls 102. The space in the electrical connector housing 10 is partitioned into the first accommodating space 104a and the second accommodating space 104b by the partition plate 11. The two electrical connector bodies are respectively disposed in the first accommodating space 104a and the second accommodating space 104b. The interface end of each electrical connector body corresponds to the first opening 105. The electrical connecting end of each electrical connector body corresponds to the second opening 106. In this embodiment, the electrical connector 1 is a horizontal electrical connector. Thus, the second opening 106 is disposed on the lower surface 101 of the electrical connector housing 10. The electrical connector 1 can also be a vertical electrical connector. The second opening 106 can also be disposed on one end of the electrical connector housing 10 opposite to the first opening 105.

Figure 4:
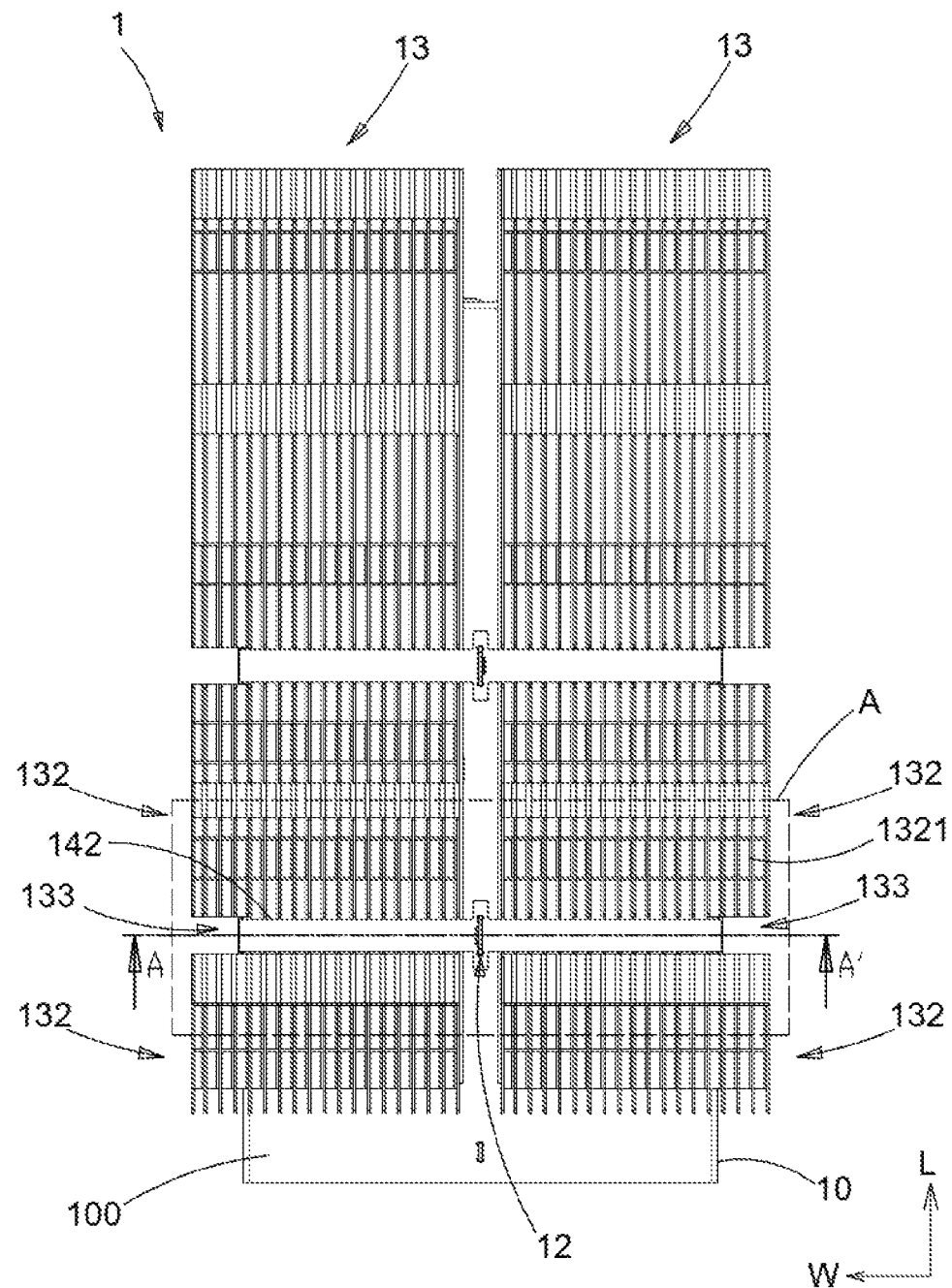
FIG. 4 is a schematic diagram of the electrical connector of the first embodiment of the present disclosure.
Figure 5:
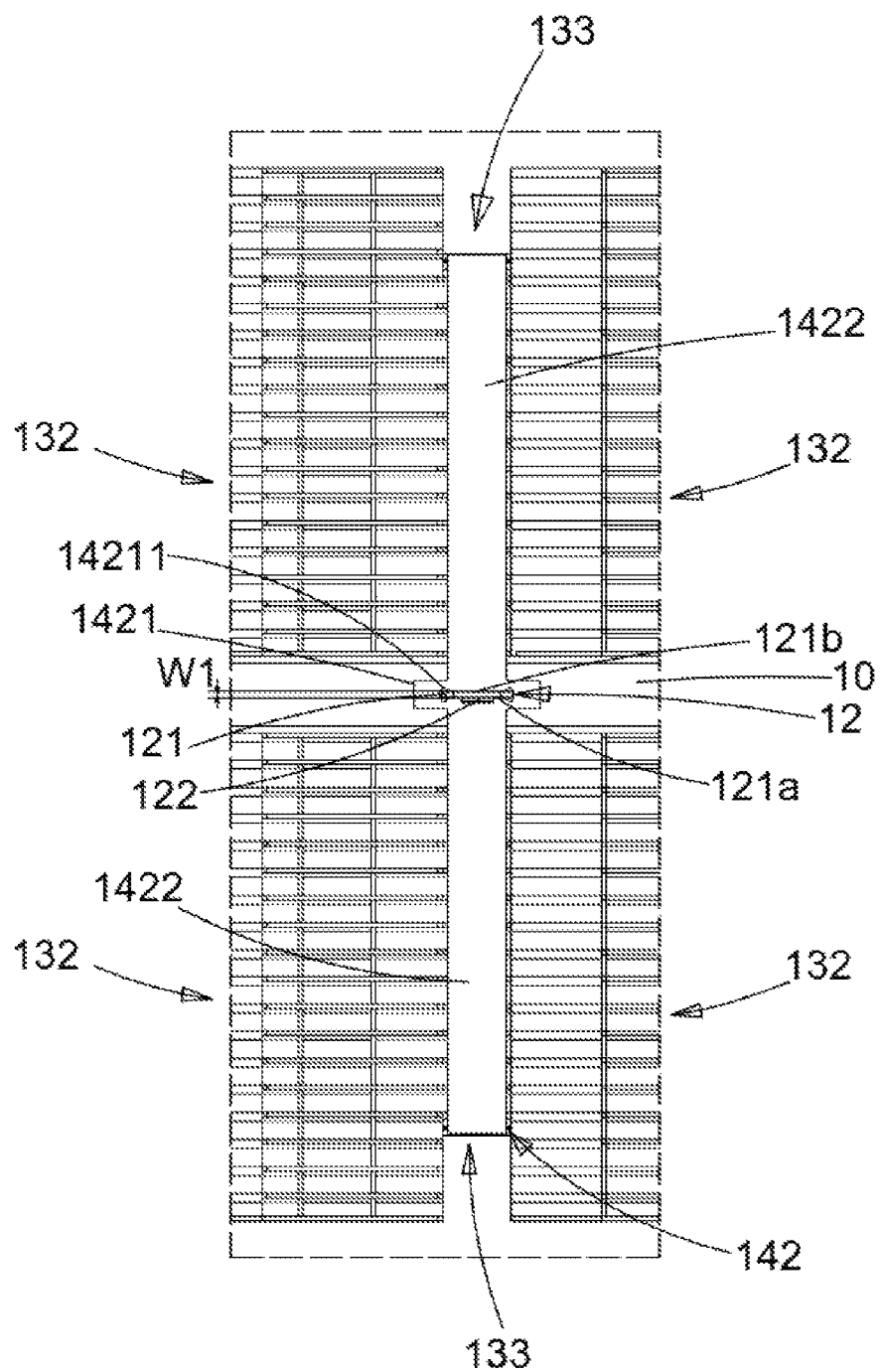
FIG. 5 is an enlarged view of area A of FIG. 4.
Figure 6:
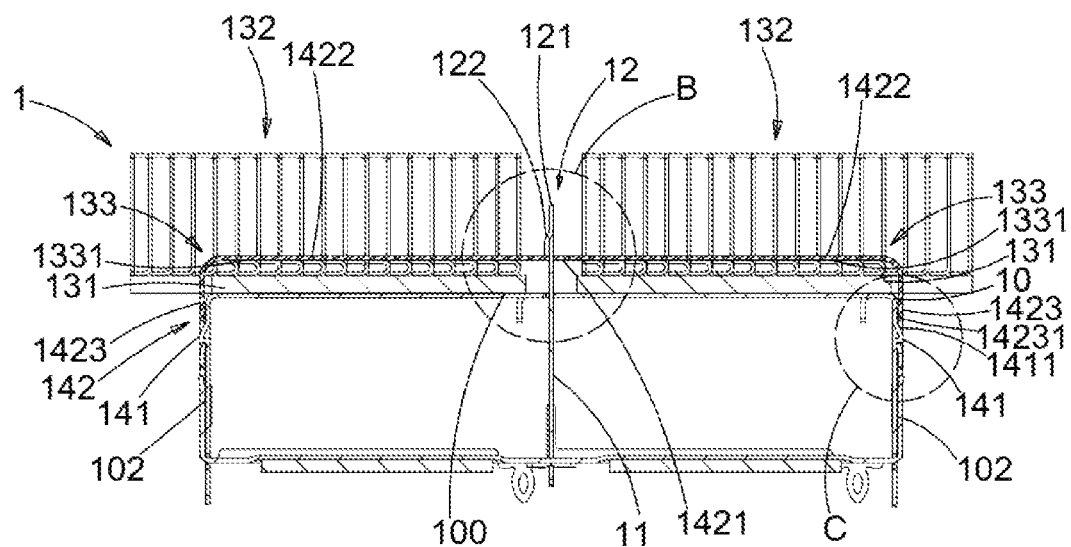
FIG. 6 is a cross-sectional view taken along line AA' of FIG. 4.
Figure 7:
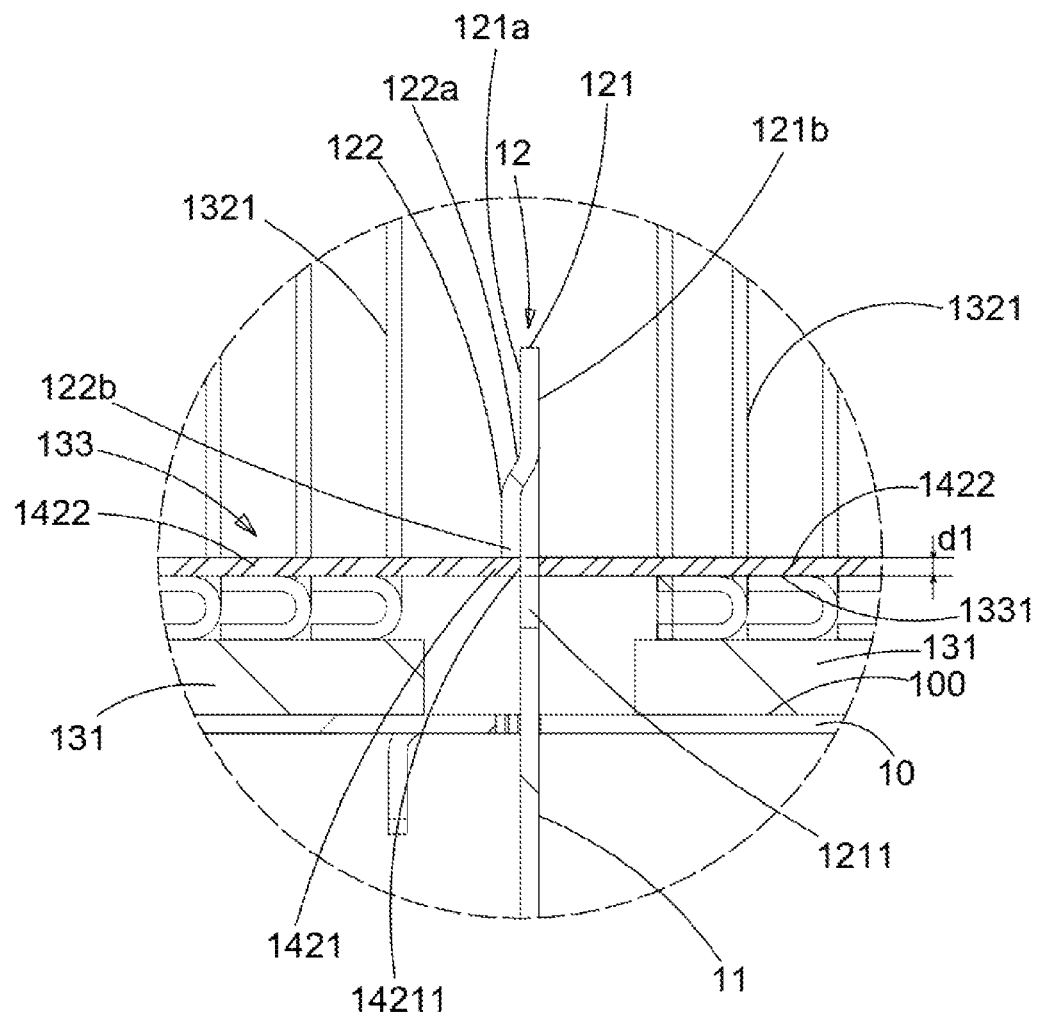
FIG. 7 is an enlarged view of area B of FIG. 6.
Figure 8:
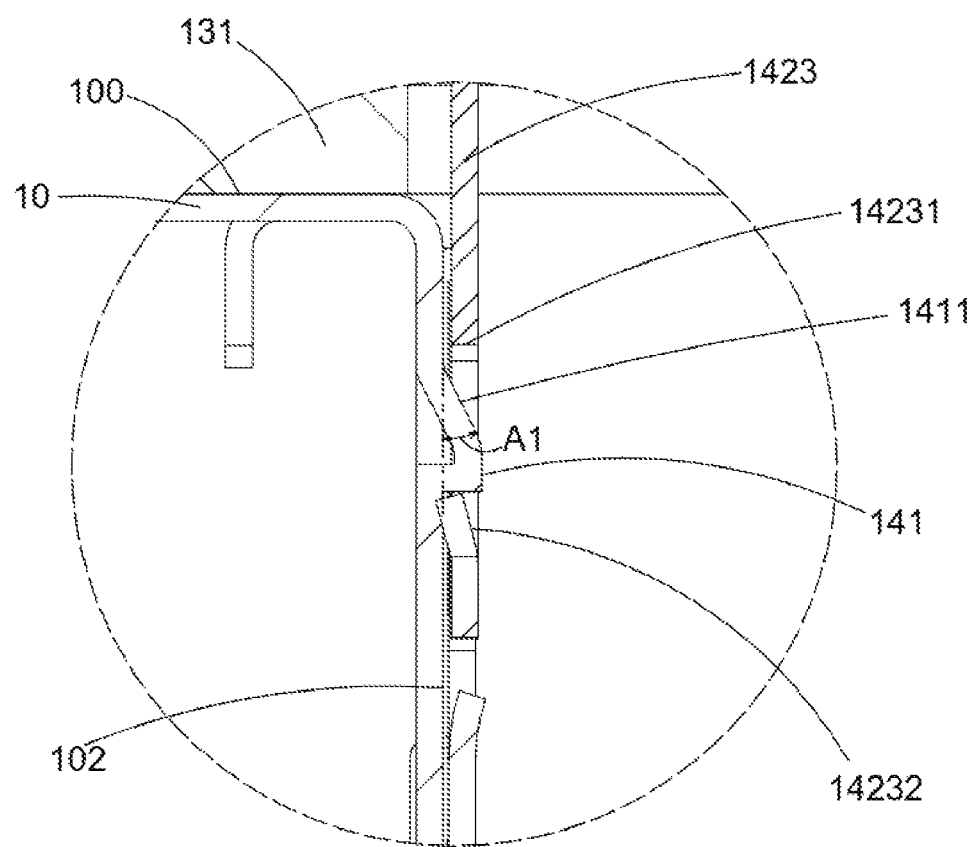
FIG. 8 is an enlarged view of area C of FIG. 6.

The positioning component 12 is disposed on one side of the partition plate 11 connected to the upper surface 100. In this embodiment, the positioning component 12 and the partition plate 11 are integrally formed. The positioning component 12 penetrates from the upper surface 100 to be disposed on the upper surface 100 of the electrical connector housing 10. FIG. 4 is a schematic diagram of the electrical connector of the first embodiment of the present disclosure. FIG. 5 is an enlarged view of area A of FIG. 4. FIG. 6 is a cross-sectional view taken along line AA' of FIG. 4. FIG. 7 is an enlarged view of area B of FIG. 6. FIG. 8 is an enlarged view of area C of FIG. 6. The positioning component 12 comprises a positioning body 121 and an elastic plate 122. The positioning body 121 comprises two surfaces in which one surface is opposite to another. The two surfaces are represented by a first positioning surface 121a and a second positioning surface 121b. The positioning body 121 comprises a retaining hole 1211. In this embodiment, the retaining hole 1211 penetrates the first positioning surface 121a and the second positioning surface 121b. The elastic plate 122 has a connecting end 122a and a movable end 122b. The connecting end 122a is connected to the side of the retaining hole 1211 away from the electrical connector housing 10. The elastic plate 122 extends toward the electrical connector housing 10. The movable end 122b is away from the surface of the positioning body 121. The movable end 122b is disposed on one side of the surface of the positioning body 121. In this embodiment, the movable end 122b is away from the first positioning surface 121a and is disposed at one side of the first positioning surface 121a. The retaining hole 1211 allows the movable end 122b to temporarily enter while the elastic plate 122 is being compressed. The retaining hole 1211 may also not penetrate the positioning body 121 as a blind hole. The opening direction of the retaining hole 1211 faces the movable end 122b of the elastic plate 122.

The two heat sinks 13 are disposed on the upper surface 100 of the electrical connector housing 10. The two heat sinks 13 are arranged along the width direction W of the electrical connector housing 10. The two heat sinks 13 are respectively disposed on two sides of the positioning component 12. The two heat sinks 13 respectively correspond to the electrical connector body disposed in the first accommodating space 104a and the electrical connector body disposed in the second accommodating space 104b. Each heat sink 13 comprises a cooling base 131 and a plurality of cooling fin sets 132 disposed on the cooling base 131 at intervals. The cooling base 131 is disposed on the upper surface 100 of the electrical connector housing 10. The plurality of cooling fin sets 132 are away from the electrical connector housing 10 and is arranged along the length direction L of the electrical connector housing 10. Each cooling fin set 132 comprises a plurality of cooling fins 1321 arranged along the width direction W of the electrical connector housing 10. In this embodiment, each heat sink 13 comprises securing grooves 133. In this embodiment, each securing groove 133 is between two adjacent cooling fin sets 132. Each securing groove 133 extends along the width direction W of the electrical connector housing 10. The securing grooves 133 of a heat sink 13 correspond to the securing grooves 133 of the adjacent heat sink 13. The securing grooves 133 correspond to the positioning components 12. That is, the two opposite securing grooves 133 are disposed on two sides of the positioning component 12.

The securing structure 14 is secured to the positioning component 12 and the two sidewalls 102 of the electrical connector housing 10. The securing structure 14 presses the two heat sinks 13 on the upper surface 100 of the electrical connector housing 10 to secure the two heat sinks 13 onto the upper surface 100 of the electrical connector housing 10. The securing structure 14 comprises two securing blocks 141 and securing components 142. The two securing blocks 141 are respectively disposed on the two sidewalls 102 of the electrical connector housing 10, and respectively correspond to the two securing grooves 133. Each of the securing components 142 comprises a first securing plate 1421, two pressing plates 1422, and two second securing plates 1423. The first securing plate 1421 comprises securing holes 14211. The two pressing plates 1422 are disposed on two sides of the first securing plate 1421. Each second securing plate 1423 is disposed at one end of the corresponding pressing plate 1422 away from the first securing plate 1421. The extending direction of each second securing plate 1423 forms an angle with the extending direction of the pressing plate 1422. In this embodiment, the angle is smaller than or equal to 90 degrees. One end of each second securing plate 1423 away from the pressing plate 1422 comprises a securing notch 14231. The two second securing plates 1423 are respectively secured to the corresponding securing blocks 141 to be buckled into the securing notch 14231. In this embodiment, the first securing plate 1421 and the two pressing plates 1422 are on the same plane.

When the securing component 142 of the securing structure 14 secures the two heat sinks 13 onto the upper surface 100 of the electrical connector housing 10, the two pressing plates 1422 of the securing component 142 respectively correspond to the two securing grooves 133 of the two adjacent heat sinks 13. The first securing plate 1421 of the securing component 142 is secured to the positioning component 12. In this embodiment, the securing hole 14211 of the first securing plate 1421 of the securing component 142 is sleeved on the positioning component 12. The positioning component 12 passes through the securing hole 14211 of the first securing plate 1421. The width W1 of the first positioning surface 121a in which the securing hole 14211 perpendicularly projects on the positioning body 121 is equal to the thickness of the positioning body 121 (as shown in FIG. 5). The securing hole 14211 corresponds to the side of the first positioning surface 121a to compress the movable end 122b of the elastic plate 122 of the positioning component 12, which moves the movable end 122b of the elastic plate 122 into the retaining hole 1211. While the first securing plate 1421 passes through the elastic plate 122, the elastic plate 122 is no longer compressed and returned to the initial position. Therefore, when the first securing plate 1421 is secured to the positioning component 12, the end surface of the movable end 122b of the elastic plate 122 abuts against the surface of the first securing plate 1421, thereby preventing the securing component 142 from coming off the positioning component 12.

In this embodiment, there is a gap d1 between the end surface of the movable end 122b of the elastic plate 122 and the bottom surface 1331 of the corresponding securing groove 133. The gap d1 is smaller than or equal to the thickness of the pressing plate 1422. The bottom surface 1331 of the securing groove 133 is away from the surface of the electrical connector housing 10. In this embodiment, the distance d1 between the end surface of the movable end 122b of the elastic plate 122 and the bottom surface 1331 of the corresponding securing groove 133 is equal to the thickness of the pressing plate 1422 (shown in FIG. 7). In this way, the end surface of the movable end 122b of the elastic plate 122 perfectly abuts the surface of the first securing plate 1421, so as to restrict the securing component 142 on the positioning component 12.

The width W1 of the securing hole 14211 perpendicularly projecting to the first positioning surface 121a of the positioning body 121 is equal to the thickness of the positioning body 121, which is merely one embodiment of the present disclosure. The width W1 of the securing hole 14211 perpendicularly projecting to the first positioning surface 121a of the positioning body 121 may also be greater than the thickness of the positioning body 121. It is only required that the end surface of the movable end 122b of the elastic plate 122 could abut against the surface of the first securing plate 1421.

In addition, the two second securing plates 1423 are respectively secured to the corresponding sidewalls 102. The two pressing plates 1422 respectively press the bottom surface 1331 of the corresponding securing groove 133. In this embodiment, the securing notch 14231 of each second securing plate 1423 is sleeved on the corresponding securing block 141 (shown in FIG. 8). Thus, the second securing plate 1423 provides a force to the corresponding pressing plate 1422 in the direction towards the electrical connector housing 10, so that the two pressing plates 1422 are respectively pressed against on the bottom surface 1331 of the corresponding securing grooves 133 to secure two adjacent heat sinks 13 onto the upper surface 100 of the electrical connector housing 10.

The angle between the extending direction of each second securing plate 1423 and the extending direction of the pressing plate 1422 is smaller than or equal to 90 degrees. The two second securing plates 1423 are pressed against two opposite sidewalls 102 of the electrical connector housing 10. The two second securing plates 1423 could clamp the two opposite sidewalls 102 of the electrical connector housing 10. Thus, the stability of the securing component 142 secured to the electrical connector housing 10 is reinforced to prevent the securing component 142 from detaching from the electrical connector housing 10. The fact that the angle between the extending direction of each second securing plate 1423 and the extending direction of the pressing plate 1422 is smaller than or equal to 90 degrees is merely an embodiment of the present disclosure. The angle between the extending direction of the second securing plate 1423 and the extending direction of the pressing plate 1422 can also be selected to be greater than 90 degrees as long as the second securing plate 1423 can be secured to the corresponding securing block 141.

In another embodiment, the gap d1 between the end surface of the movable end 122b of the elastic plate 122 and the bottom surface 1331 of the corresponding securing groove 133 is smaller than the thickness of the pressing plate 1422. Therefore, the end surface of the movable end 122b of the elastic plate 122 would be pressed against the surface of the first securing plate 1421; the first securing plate 1421 would give a greater force to the pressing plates 1422 on both sides of the first pressing plate 1421 in a direction towards the electrical connector housing 10. Meanwhile, each second securing plate 1423 also provides a force to the corresponding pressing plate 1422 in a direction towards the electrical connector housing 10, so that the surface of each pressing plate 1422 can be completely attached to the bottom surface 1331 of the corresponding securing groove 133. This would effectively improve the stability in which the securing component 142 secures the two heat sinks 13 to the electrical connector housing 10.

Figure 9:
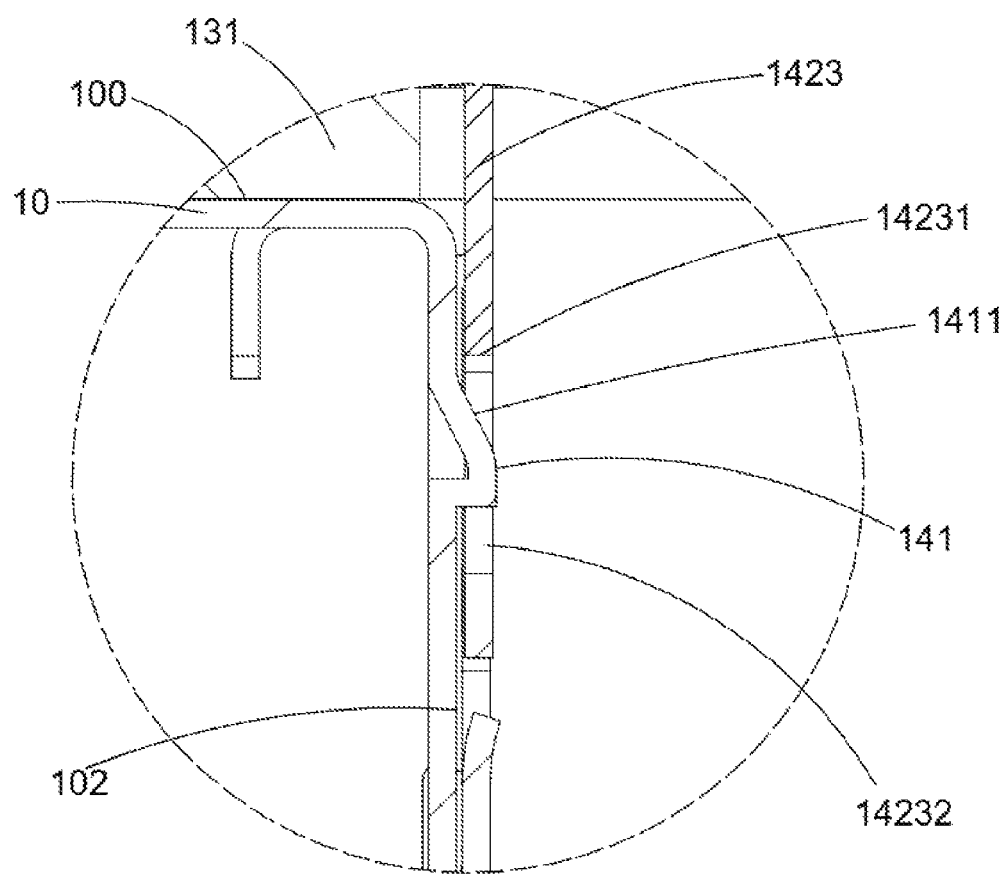
FIG. 9 is a partially enlarged view of the securing structure of the second embodiment of the present disclosure.

In another embodiment, referring to FIG. 8 again, a stopper 14232 is provided in the securing notch 14231 of the second securing plate 1423. One end of the stopper 14232 is connected to the side of the securing notch 14231, and the other end is movable in the securing notch 14231 and is bent toward the securing block 141. While the securing block 141 is in the securing notch 14231, the other end of the stopper 14232 abuts against the side surface of the securing block 141, so that the securing block 141 would be restricted in the securing notch 14231, making the second securing plate 1423 not to be easily disengaged from the securing block 141. In another embodiment, as shown in FIG. 9, the other end of the stopper 14232 may not be bent toward the securing block 141, which could also achieve the above-mentioned function, and hence would not be repeated herein.

In another embodiment, the securing block 141 comprises an inclined surface 1411 closing to the upper surface 100 of the electrical connector housing 10. The angle A1 between the inclined surface 1411 and the corresponding sidewall 102 is smaller than 90 degrees. While one end of the second securing plate 1423 comprising the securing notch 14231 moves toward the corresponding securing block 141, one end of the second seeming plate 1423 comprising the securing notch 14231 contacts the inclined surface 1411. As one end of the second securing plate 1423 comprising the securing notch 14231 continues to move toward the corresponding securing block 141, one end of the second securing plate 1423 comprising the securing notch 14231 moves along the inclined surface 1411, to keep the second securing plate 1423 away from the sidewall 102 of the electrical connector housing 10, and the angle between the second securing plate 1423 and the corresponding pressing plate 1422 is greater than 90 degrees. The angle between the second securing plate 1423 and the corresponding pressing plate 1422 would return to be smaller than or equal to 90 degrees until the securing notch 14231 of the second securing plate 1423 engages the corresponding securing block 141. As described above, the inclined surface 1411 assists the second securing plate 1423 to automatically expand outward as the securing block 141 is provided with the inclined surface 1411, and it is not necessary to manually open the two second securing plates 1423, which facilitates the disposal of the securing component 142.

The partition plate 11 and the positioning component 12 of this embodiment are integrally formed. In another embodiment, the partition plate 11 may also be disposed separately from the positioning component 12. That is, the partition plate 11 and the positioning component 12 are individually disposed on the electrical connector housing 10. If there is only one electrical connector body accommodated in the electrical connector housing 10, the partition plate 11 can be omitted. The number of the securing grooves 133 of each heat sink 13 could be one or more. A positioning component 12 is disposed between two opposite securing grooves 133. A securing structure 14 is disposed on the corresponding two securing grooves 133 and the positioning component 12. Each securing structure 14 is secured onto the electrical connector housing 10 to secure two heat sinks 13 on the electrical connector housing 10. This embodiment illustrates that the second securing plate 1423 is secured to the sidewall 102 by the combination of the securing notch 14231 and the securing block 141, which is merely an embodiment of the present disclosure. The two second securing plates 1423 are secured to the two sidewalls 102 of the electrical connector housing 10 by engaging with the slot of the securing blocks 141 or by elastically clamping the sidewalls 102 if the securing blocks 141 are omitted. Alternatively, a securing notch 14231 could be provided on the sidewall 102 of the electrical connector housing 10, and a securing block 141 could be provided on the second securing plate 1423, so that the securing block 141 of the second securing plate 1423 can be secured into the securing notch 14231 of the electrical connector housing 10. This means that the second securing plate 1423 can be secured to the electrical connector housing 10 by a method other than the embodiment of the present disclosure, and should not be limited to this.

Figure 10:
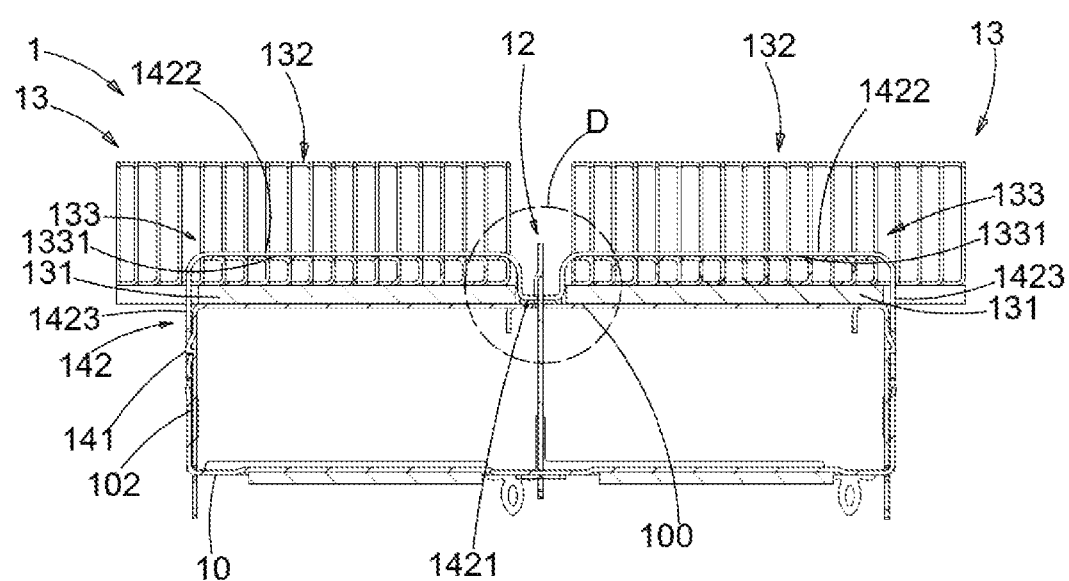
FIG. 10 is a cross-sectional view of the electrical connector of the third embodiment of the present disclosure.
Figure 11:
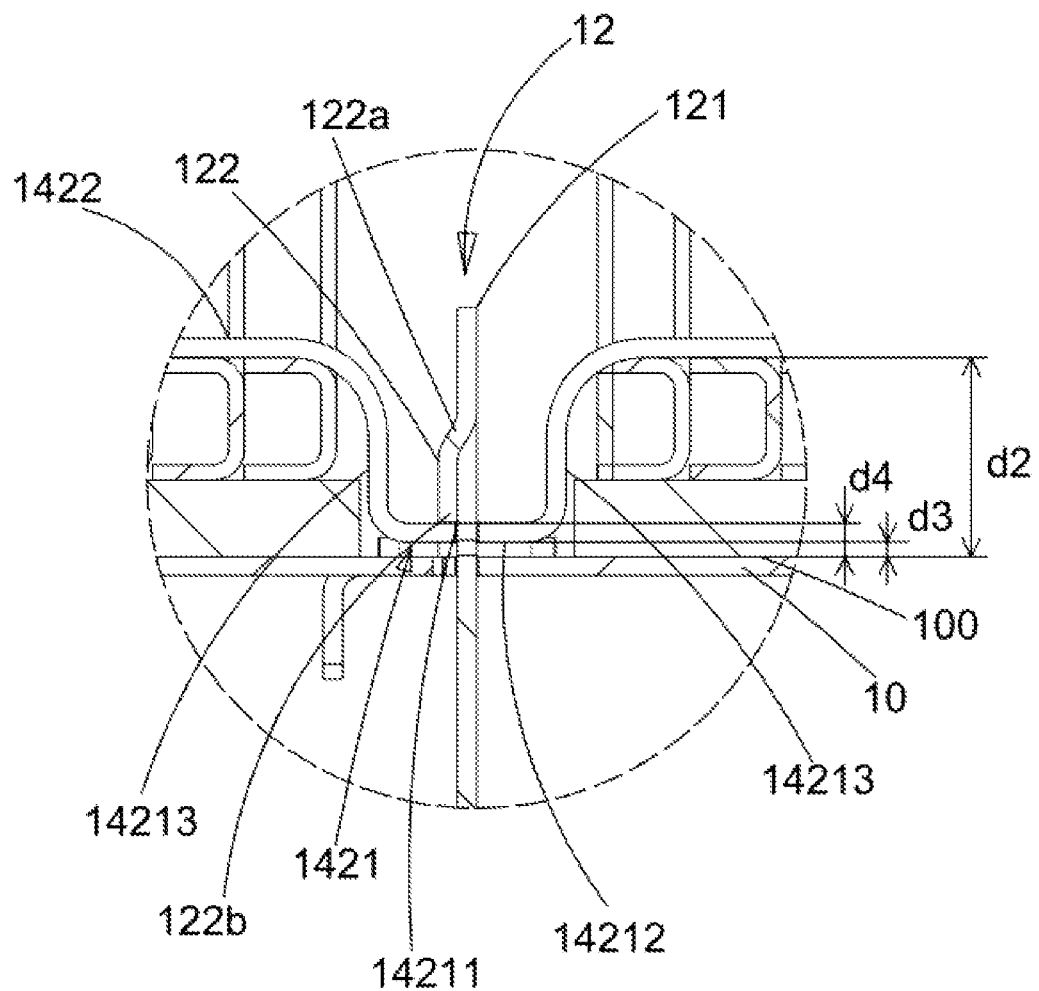
FIG. 11 is an enlarged view of area D of FIG. 10.

FIG. 10 is a cross-sectional view of the electrical connector of the third embodiment of the present disclosure. FIG. 11 is an enlarged view of area D of FIG. 10. As shown in the figures, the electrical connector 1 of the present embodiment is different from that of the first embodiment in that the first securing plate 1421 of the securing component 142 of the present embodiment is U-shaped. This indicates that the first securing plate 1421 comprises a first main securing elastic plate 14212 and two first side securing elastic plates 14213. The two first side securing elastic plates 14213 are disposed on both sides of the first main securing elastic plate 14212. Each first side securing elastic plate 14213 is connected to a corresponding pressing plate 1422. While the securing component 142 secures the two heat sinks 13 onto the electrical connector housing 10, the surfaces of the two pressing plates 1422 completely abut against on the bottom surfaces 1331 of the two securing grooves 133, making that the gap d2 between the bottom surface 1331 of the securing groove 133 and the upper surface 100 of the electrical connector housing 10 is greater than the gap d3 between the first main securing elastic plate 14142 and the upper surface 100 of the electrical connector housing 10. In other words, the length of the first securing elastic plate 14213 is equal to the gap between the first main securing elastic plate 14212 and the bottom surface 1331 of the securing groove 133.

While the first main securing elastic plate 14212 is secured on the positioning component 12, the two first side securing elastic plates 14213 respectively provide corresponding forces pushing the pressing plates 1422 towards the electrical connector housing 10, without generating forces in other directions to ensure that the surface of the pressing plate 1422 completely seats on the bottom surface 1331 of the securing groove 133. Moreover, the gap between the bottom surface 1331 of the securing groove 133 and the upper surface 100 of the electrical connector housing 10 is greater than the gap between the first main securing elastic plate 14212 and the upper surface 100 of the electrical connector housing 10. The first main securing elastic plate 14212 is closer to the upper surface 100 of the electrical connector housing 10 than to the bottom surface 1331 of the securing groove 133. Meanwhile, the gap d4 between the end surface of the movable end 122b of the elastic plate 122 of the positioning component 12 and the upper surface 100 of the electrical connector housing 10 is smaller than the gap d2 between the bottom surface 1331 of the securing groove 133 and the upper surface 100 of the electrical connector housing 10. The end surface of the movable end 122b of the elastic plate 122 of the positioning component 12 abuts against the first main securing elastic plate 14212.

Figure 12:
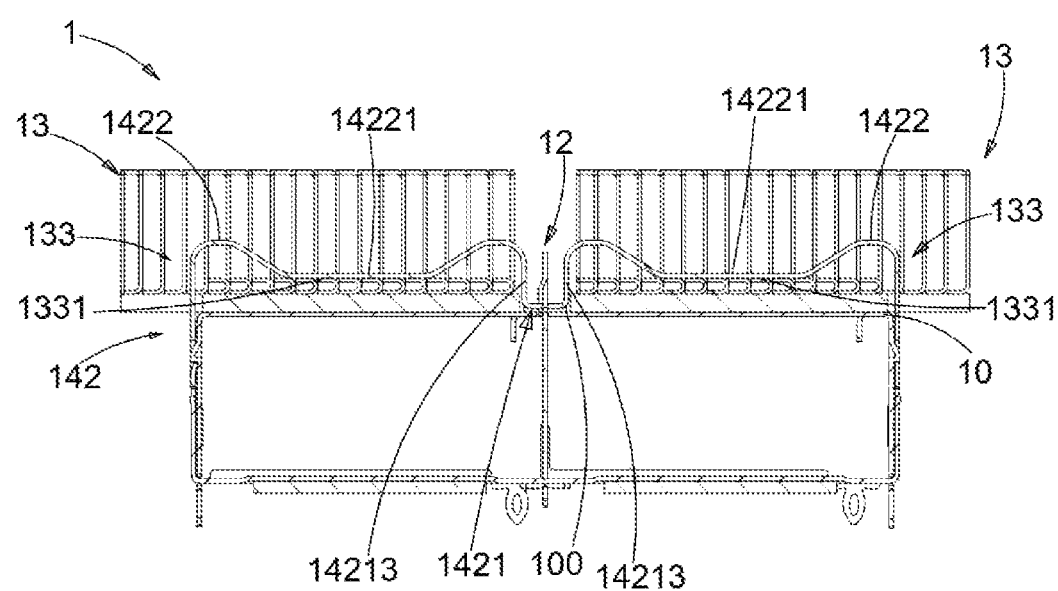
FIG. 12 is a cross-sectional view of the electrical connector of the fourth embodiment of the present disclosure.

FIG. 12 is a cross-sectional view of the electrical connector of the fourth embodiment of the present disclosure. The electrical connector 1 of the present embodiment is different from that of the third embodiment in that each pressing plate 1422 of the securing component 142 of the present embodiment comprises pressing bumps 14221. While the securing component 142 secures the two heat sinks 13 onto the electrical connector housing 10, the pressing bumps 14221 of each pressing plate 1422 is pressed against the bottom surface 1331 of the corresponding securing groove 133. The pressing bumps 14221 would not deform as the first side securing elastic plate 14213 and the second securing plate 1423 provides forces pushing the pressing plate 1422 towards the electrical connector housing 10. The contacting between the pressing bumps 14221 and the bottom surface 1331 of the securing groove 133 can be maintained, and the securing component 142 can stably secure the two heat sinks 13 onto the electrical connector housing 10.

Figure 13:
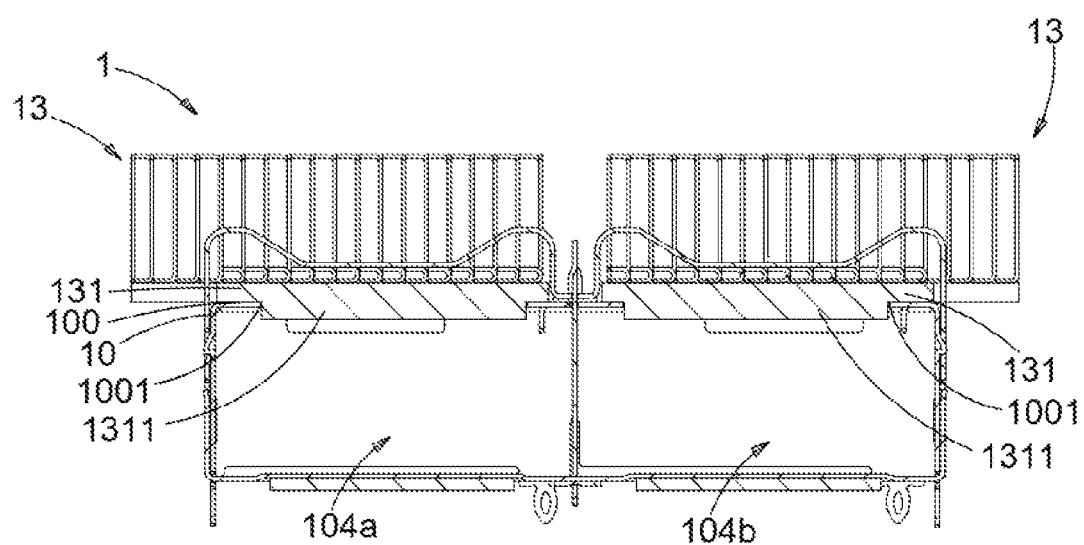
FIG. 13 is a cross-sectional view of the electrical connector of the fifth embodiment of the present disclosure.

FIG. 13 is a cross-sectional view of the electrical connector of the fifth embodiment of the present disclosure. The electrical connector 1 of the present embodiment is different from that of the third embodiment in that the upper surface 100 of the electrical connector housing 10 of the present embodiment comprises two positioning holes 1001 communicating with the first accommodating space 104a and the second accommodating space 104b, respectively. In addition, the cooling base 131 of each heat sink 13 comprises a positioning bumps 1311 on a surface facing the electrical connector housing 10. While each heat sink 13 is disposed on the electrical connector housing 10, the positioning bump 1311 of the cooling base 131 of the heat sink 13 is disposed in the corresponding positioning hole 1001. In this way, the position of the heat sink 13 on the electrical connector housing 10 can be positioned. Meanwhile, the positioning bump 1311 disposed in the positioning hole 1001 would enter the corresponding accommodating space. In this way, each heat sink 13 can directly contact the heat source generated by the electrical connector body during operation, and the heat can be quickly conducted to the outside through the heat sink 13, producing an excellent cooling performance to the electrical connector 1.

Figure 14:
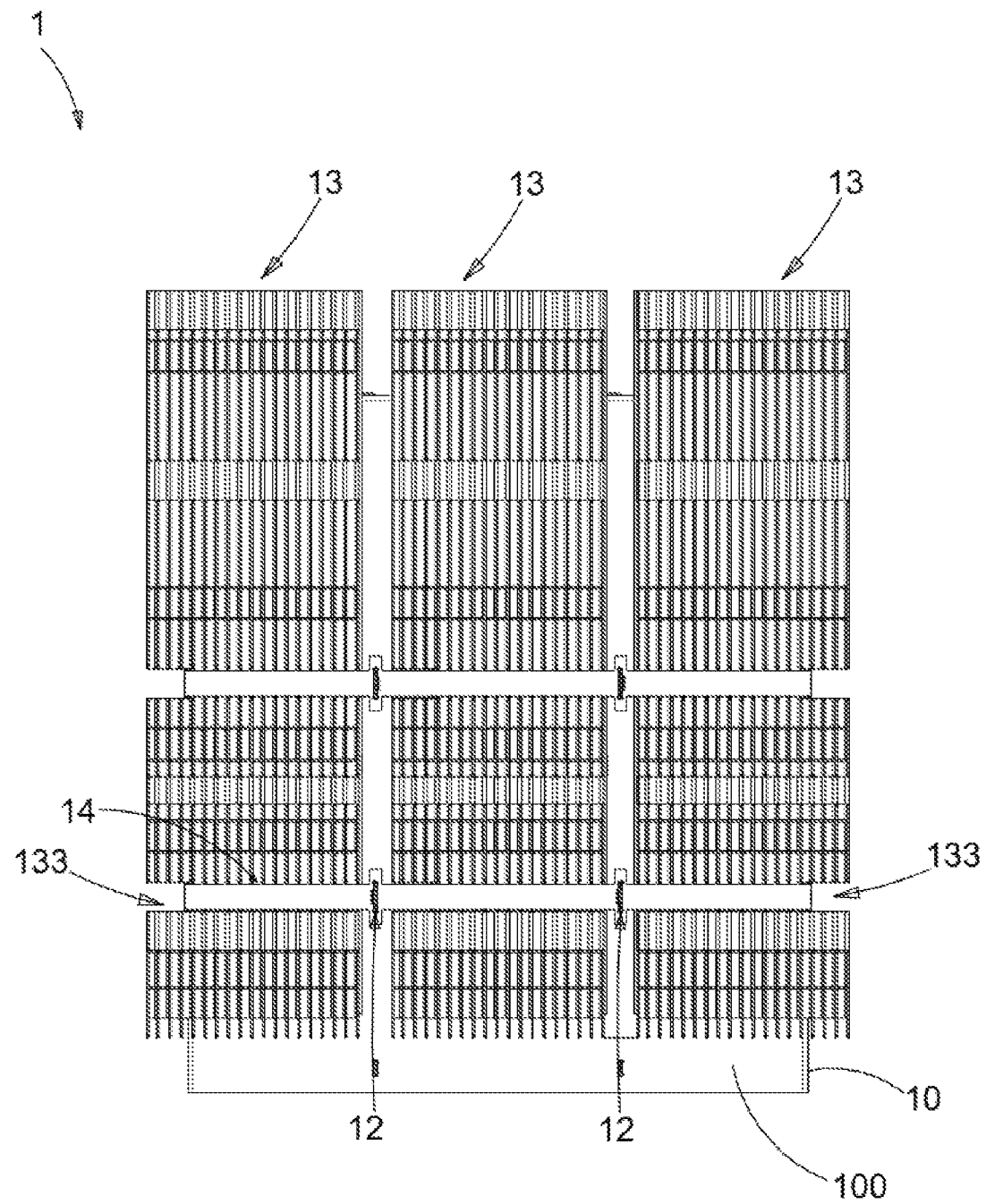
FIG. 14 is a schematic diagram of the electrical connector of the sixth embodiment of the present disclosure.

FIG. 14 is a schematic diagram of the electrical connector of the sixth embodiment of the present disclosure. The electrical connector 1 of this embodiment is different from those of the above embodiments in that the number of the heat sinks 13 of this embodiment is three; the three heat sinks 13 are disposed on the upper surface 100 of the electrical connector housing 10 at intervals; each heat sink 13 comprises securing grooves 133; the securing grooves 133 of a heat sink 13 correspond to the securing grooves 133 of adjacent heat sinks 13. Details of each heat sink 13 have been described in the above embodiments, and would not be repeated herein.

In this embodiment, there are two positioning components 12 correspond to each securing structure 14. Two positioning components 12 are disposed on the upper surface 100 of the electrical connector housing 10. Each positioning component 12 is disposed between two adjacent heat sinks 13 and corresponds to two securing grooves 133 of the two heat sinks 13. The securing structure 14 is secured on the two positioning components 12 and the two sidewalls of the electrical connector housing 10. The securing structure 14 presses the three heat sinks 13 on the upper surface 100 of the electrical connector housing 10. The securing method of the securing structure 14 and the positioning component 12 has been described in the above embodiments, so it would not be described herein.

Figure 15:
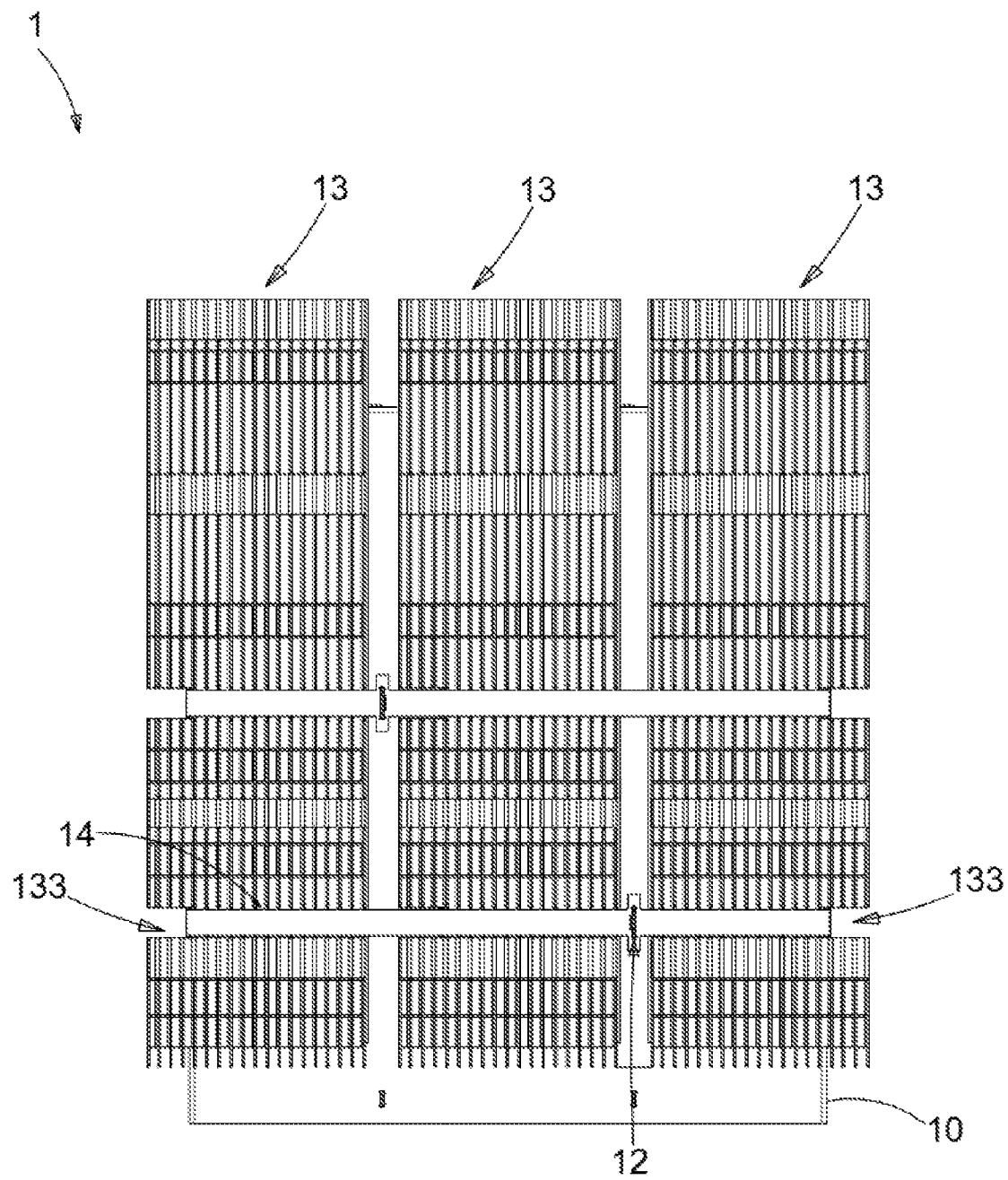
FIG. 15 is a schematic diagram of the electrical connector of the seventh embodiment of the present disclosure.

FIG. 15 is a schematic diagram of the electrical connector of the seventh embodiment of the present disclosure. The electrical connector 1 of the present embodiment is different from that of the sixth embodiment in that there is one positioning component 12 corresponds to each securing structure 14. The positioning component 12 is disposed on the upper surface 100 of the electrical connector housing 10. The positioning component 12 is disposed between two adjacent heat sinks 13. The positioning component 12 corresponds to the two securing grooves 133 of the two heat sinks 13. The securing structure 14 is secured on the positioning component 12 and two sidewalls of the electrical connector housing 10. The securing structure 14 presses the three heat sinks 13 on the upper surface 100 of the electrical connector housing 10. This indicates that the lengths of the securing structure 14 on two sides of the positioning component 12 are different. It could also indicate that the securing structure 14 can be asymmetric.

In summary, the present disclosure provides an electrical connector on which heat sinks are secured by securing structure secured to the electrical connector housing by a positioning component preventing the securing structure from detaching from the electrical connector housing, thereby improving the stability of the seeming of the heat sink to the electrical connector housing, especially to simultaneously secure two or more heat sinks onto the electrical connector housing by the securing structure and the positioning component. Therefore, the problem of unsuccessful to secure multiple heat sinks onto an electrical connector could be solved. The positioning component abuts against the securing structure through the elastic plate, which effectively prevents the securing structure from detaching. Meanwhile, it also provides a force to the securing structure to secure the heat sinks, pressing the securing structure against the heat sinks, which prevents the heat sinks from detaching from the electrical connector housing.

It is to be understood that the term "comprises", "comprising", or any other variants thereof, is intended to encompass a non-exclusive inclusion, such that a process, method, article, or device of a series of elements not only include those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present invention has been explained in relation to its preferred embodiment, it does not intend to limit the present invention. It will be apparent to those skilled in the art having regard to this present invention that other modifications of the exemplary embodiments beyond those embodiments specifically described here may be made without departing from the spirit of the invention. Accordingly, such modifications are considered within the scope of the invention as limited solely by the appended claims.

What is claimed is:

1. An electrical connector, comprising:
    an electrical connector housing comprising an upper surface, a lower surface, and two opposite sidewalls;
    at least one positioning component disposed on the upper surface of the electrical connector housing;
    a plurality of heat sinks disposed on the upper surface of the electrical connector housing; the plurality of the heat sinks being respectively disposed on two sides of the corresponding positioning component; each heat sink comprising at least one securing groove; the securing grooves of the heat sinks disposed correspondingly; the plurality of the securing grooves corresponding to the positioning components; and a securing structure secured to the at least one the positioning component and the two sidewalls of the electrical connector housing; the securing structure presses the plurality of the heat sinks against the upper surface of the electrical connector housing;

wherein the securing structure comprises a securing component comprising a first securing plate, and the first securing plate is secured to the positioning component, and wherein the positioning component comprises a positioning body and an elastic plate, the positioning body comprises a retaining hole; the elastic plate comprises a connecting end and a movable end; the connecting end is connected to the side of the retaining hole away from the electrical connector housing; the elastic plate extends toward the electrical connector housing; the movable end is away from the surface of the positioning body; the movable end is disposed on one side of the surface of the positioning body; one end surface of the movable end of the elastic plate abuts against the surface of the first securing plate when the first securing plate is secured to the positioning component.

2. The electrical connector according to claim 1, wherein the securing component further comprises:

two pressing plates; and two second securing plates;

wherein the two pressing plates are disposed on both sides of the first securing plate; each second securing plates is disposed on one end of the corresponding pressing plate away from the first securing plate; two second securing plates are respectively secured to the corresponding sidewalls; the two pressing plates respectively press against the bottom surface of the corresponding securing grooves.

3. The electrical connector according to claim 2, wherein the first securing plate and the two pressing plates are in the same plane; the gap between the end surface of the movable end of the elastic plate and the bottom surface of the securing groove is smaller than or equal to the thickness of the pressing plate.

4. The electrical connector according to claim 2, wherein the first securing plate is U-shaped; the first securing plate comprises a first main securing elastic plate and two first side securing elastic plates; the end surface of the movable end of the elastic plate abuts against the first main securing elastic plate; the gap between the end surface of the movable end of the elastic plate and the upper surface of the electrical connector housing is smaller than the gap between the bottom surface of the securing groove and the upper surface of the electrical connector housing.

5. The electrical connector according to claim 4, wherein each pressing plate comprises a pressing bump pressed against the bottom surface of the corresponding securing groove.

6. The electrical connector according to claim 2, wherein the extending direction of the second securing plate forms an angle with the extending direction of the pressing plate; the angle is smaller than or equal to 90 degrees.

7. The electrical connector according to claim 2, wherein the securing structure further comprises two securing blocks; the two securing blocks are respectively disposed on the two sidewalls; the two securing blocks correspond to the securing grooves; the two second securing plates are respectively secured to the corresponding securing blocks.

8. The electrical connector according to claim 7, wherein one end of the second securing plate away from the pressing plate comprises a securing notch; the securing block is buckled into the securing notch.

9. The electrical connector according to claim 7, wherein each securing block comprises an inclined surface close to the upper surface of the electrical connector housing.

10. The electrical connector according to claim 1, wherein the first securing plate comprises a securing hole; the positioning component passes through the securing hole.

11. The electrical connector according to claim 10, wherein the width of the securing hole perpendicular to the surface of the positioning body is greater than or equal to the thickness of the positioning body.

12. The electrical connector according to claim 1, wherein each heat sink comprises a cooling base and a plurality of cooling fin sets disposed on the cooling base at intervals; the securing groove is between the two adjacent cooling fin sets.

13. The electrical connector according to claim 12, wherein the upper surface of the electrical connector housing comprises two positioning holes; the cooling base of each heat sink comprises positioning bumps on a surface facing the electrical connector housing; each positioning bump is disposed in the corresponding positioning hole.

14. The electrical connector according to claim 1, further comprising: a partition plate disposed in the electrical connector housing; the upper side of the partition plate being connected to the upper surface of the electrical connector housing; the lower side of the partition plate being connected to the lower surface of the electrical connector housing; the partition plate being parallel to the sidewalls of the electrical connector housing.

15. The electrical connector according to claim 14, wherein the positioning component is disposed on one side where the partition plate connected to the upper surface of the electrical connector housing; the positioning component is integrally formed with the partition plate; the positioning component penetrates from the upper surface.

* * * * *